United States Patent
Park et al.

(10) Patent No.: US 9,444,031 B2
(45) Date of Patent: Sep. 13, 2016

(54) ENERGY HARVESTER USING MASS AND MOBILE DEVICE INCLUDING THE ENERGY HARVESTER

(71) Applicant: SAMSUNG ELECTRONICS CO., LTD., Suwon-si (KR)

(72) Inventors: Young-jun Park, Suwon-si (KR); Jin S. Heo, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 427 days.

(21) Appl. No.: 14/080,318

(22) Filed: Nov. 14, 2013

(65) Prior Publication Data

US 2015/0001993 A1 Jan. 1, 2015

(30) Foreign Application Priority Data

Jun. 28, 2013 (KR) .................. 10-2013-0075942

(51) Int. Cl.
*H01L 41/113* (2006.01)
*H02N 1/04* (2006.01)
*H02N 2/18* (2006.01)

(52) U.S. Cl.
CPC .............. *H01L 41/113* (2013.01); *H02N 1/04* (2013.01); *H02N 2/18* (2013.01)

(58) Field of Classification Search
CPC ...... F03G 7/08; H02K 35/02; H02K 7/1853; F02B 63/04; F02B 71/04; H02N 2/18; H02N 2/183; H02N 2/186; F23Q 3/002

USPC .................................. 310/311–371; 290/1 R
See application file for complete search history.

(56) References Cited

U.S. PATENT DOCUMENTS

| 4,106,279 | A | 8/1978 | Martin et al. |
| 6,586,095 | B2 | 7/2003 | Wang et al. |
| 6,911,764 | B2 | 6/2005 | Pelrine et al. |
| 8,786,246 | B2 * | 7/2014 | Tsui ...................... H02J 7/0055 320/101 |
| 2009/0066195 | A1 | 3/2009 | Wang et al. |
| 2009/0069045 | A1 | 3/2009 | Cheng |
| 2009/0115293 | A1 | 5/2009 | Wang et al. |
| 2009/0295257 | A1 * | 12/2009 | Wang ................... H01G 9/2068 310/367 |
| 2009/0309458 | A1 * | 12/2009 | Chou ....................... H02N 2/18 310/339 |
| 2010/0117488 | A1 | 5/2010 | Wang et al. |
| 2010/0221060 | A1 | 9/2010 | Yu |
| 2011/0084345 | A1 | 4/2011 | Park et al. |
| 2011/0220391 | A1 | 9/2011 | Oka et al. |

(Continued)

FOREIGN PATENT DOCUMENTS

| KR | 1020100098287 A | 9/2010 |
| KR | 10-1007197 B1 | 1/2011 |

(Continued)

*Primary Examiner* — Thomas Dougherty
(74) *Attorney, Agent, or Firm* — Sughrue Mion, PLLC

(57) ABSTRACT

Provided are an energy harvester using a mass, and a mobile device including the energy harvester. The mobile device includes an energy harvester connected to a mobile device body to generate electric energy. The energy harvester includes an energy generator configured to generate electric energy by using a mechanical force applied by a movement of the mobile device body.

18 Claims, 9 Drawing Sheets

(56) References Cited

U.S. PATENT DOCUMENTS

| | | | |
|---|---|---|---|
| 2012/0007470 A1* | 1/2012 | Kurihara | H01L 41/1136 310/329 |
| 2012/0223617 A1* | 9/2012 | Kim | H02N 2/186 310/319 |
| 2013/0106244 A1* | 5/2013 | Liu | H01L 41/1132 310/338 |
| 2013/0162192 A1 | 6/2013 | Park et al. | |
| 2014/0028569 A1* | 1/2014 | Guard | G06F 3/044 345/173 |
| 2014/0138672 A1 | 5/2014 | Park et al. | |
| 2014/0342192 A1* | 11/2014 | Wang | H01M 4/505 429/7 |

FOREIGN PATENT DOCUMENTS

| | | | | |
|---|---|---|---|---|
| KR | 10-2011-0135293 A | | 12/2011 | |
| KR | 10-1146439 B1 | | 5/2012 | |
| KR | 10-2012-0068348 A | | 6/2012 | |
| KR | 10-2012-0100294 A | | 9/2012 | |
| KR | 10-2013-0016674 A | | 2/2013 | |
| KR | 1020140063299 A | * | 5/2014 | |
| WO | WO-2012/091405 | * | 7/2012 | H01L 31/042 |

* cited by examiner

ENERGY HARVESTER USING MASS AND MOBILE DEVICE INCLUDING THE ENERGY HARVESTER

CROSS-REFERENCE TO RELATED APPLICATION

This application claims priority from Korean Patent Application No. 10-2013-0075942, filed on Jun. 28, 2013, in the Korean Intellectual Property Office, the disclosure of which is incorporated herein in its entirety by reference.

BACKGROUND

1. Field

Apparatuses consistent with exemplary embodiments relate to energy harvesters using a mass, and mobile devices including the energy harvesters.

2. Description of the Related Art

Recently, the use of smart phones has become widespread, and various attempts are being made to provide mutual control between a smart phone and a peripheral device. In particular, extensive research is being conducted into a smart watch that is a combination of a smart phone and a watch, and some prototypes thereof are being commercialized. Used as wristwatches, smart watches are being used to control or monitor functions, such as a call function, a message function, or an application of a smart phone. However, since such smart watches consume much more power than typical wristwatches, the smart watches need to be charged often or should be equipped with a high-capacity battery in order to be always supplied with power.

SUMMARY

Provided are energy harvesters using a mass, and mobile devices including the energy harvesters.

Additional aspects will be set forth in part in the description which follows and, in part, will be apparent from the description, or may be learned by practice of the presented embodiments.

According to an aspect of an exemplary embodiment, an energy harvester includes: first and second substrates spaced apart from each other, at least one of the first and second substrates being configure to be connected to a mass; first and second electrodes provided on the first and second substrates, respectively; and an energy generator provided between the first and second electrodes, wherein the energy generator generates electric energy upon a relative movement between the first and second substrates caused by a movement of the mass.

The first and second substrates may have a band-type structure, a flat-plate structure, or a core-shell structure.

The energy generator may include at least one of a piezoelectric generator and a triboelectric generator.

The energy generator may include a plurality of piezoelectric nanowires provided between the first and second electrodes. The energy generator may further include a dielectric film provided between the second electrode and the piezoelectric nanowires.

The energy generator may include a piezoelectric thin-film layer provided between the first and second electrodes. The energy generator may include: a first triboelectric layer provided on the first electrode and including a first dielectric or a metal; and a second triboelectric layer provided on the second electrode and including a second dielectric that is different from the first dielectric. A plurality of first protrusions may be formed on a surface of the first triboelectric layer, and a plurality of second protrusions may be formed on a surface of the second triboelectric layer. The first triboelectric layer may include a plurality of first wires provided on the first electrode, and the second triboelectric layer may include a plurality of second wires provided on the second electrode.

At least one spacer may be provided between the first and second substrates to maintain a distance between the first and second substrates.

According to another aspect, a mobile device includes: a mobile device body; and an energy harvester connected to the mobile device body, wherein the energy harvester generates electric energy based on a movement of the mobile device body, wherein the energy harvester includes: first and second substrates spaced apart from each other, at least one of the first and second substrates being connected to the mobile device body; first and second electrodes provided on the first and second substrates; and an energy generator provided between the first and second electrodes, wherein the energy generator generates electric energy upon a relative movement between the first and second substrates caused by the movement of the mobile device body.

According to another aspect, a mobile device includes: a mobile device body; and a plurality of energy harvesters connected to each other, at least one of the energy harvesters being connected to the mobile device body and generating electric energy based on a movement of the mobile device body, wherein the at least one energy harvester includes: first and second substrates spaced apart from each other, at least one of the first and second substrates being connected to the mobile device body; first and second electrodes provided on the first and second substrates, respectively; and an energy generator provided between the first and second electrodes, wherein the energy generator generates electric energy upon a relative movement between the first and second substrates caused by the movement of the mobile device body.

BRIEF DESCRIPTION OF THE DRAWINGS

These and/or other exemplary aspects and advantages will become apparent and more readily appreciated from the following description of exemplary embodiments, taken in conjunction with the accompanying drawings in which.

DETAILED DESCRIPTION

Figure 1:
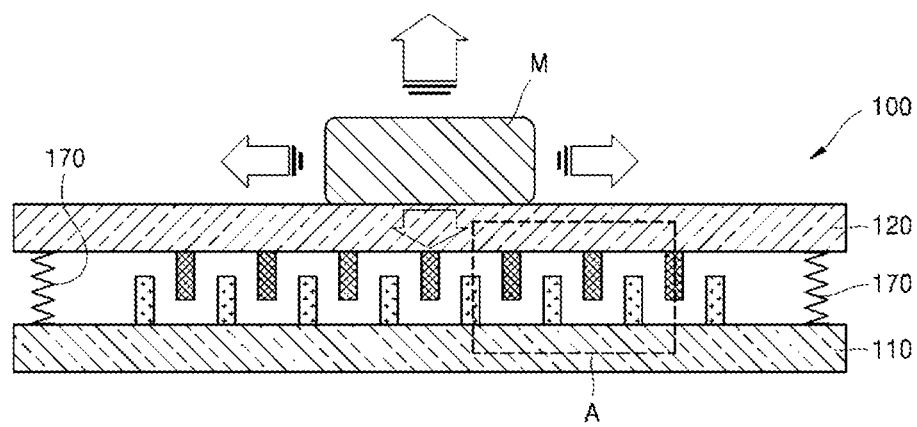
FIG. 1 is a cross-sectional view of a mobile device including an energy harvester according to an exemplary embodiment.

Reference will now be made in detail to embodiments, examples of which are illustrated in the accompanying drawings, wherein like reference numerals refer to like elements throughout. In this regard, the exemplary embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, exemplary embodiments will be described in detail with reference to the accompanying drawings. The exemplary embodiments described below should be considered in a descriptive sense only and not for purposes of limitation. In the drawings, like reference numerals denote like elements, and the sizes or thicknesses of elements are exaggerated for clarity. It will also be understood that when a layer is referred to as being "on" another layer or substrate, it may be directly on the other layer or substrate, or intervening layers may also be present. In the following embodiments, a material forming each layer is merely exemplary, and other materials may also be used.

Figure 2:
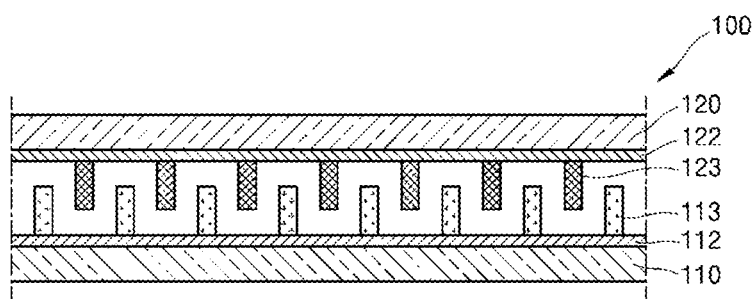
FIG. 2 is an enlarged view of a portion A of FIG. 1.

FIG. 1 is a cross-sectional view of a mobile device including an energy harvester according to an exemplary embodiment. FIG. 2 is an enlarged view of a portion A of FIG. 1.

Referring to FIGS. 1 and 2, the mobile device includes a mass M and an energy harvester 100 configured to generate electric energy by the movement of the mass M. The mobile device may be, for example, a device attached to a human body, but is not limited thereto. The mass M is a mobile device body. The mass M is connected to the energy harvester 100 to apply a mechanical force to the energy harvester 100 by the movement thereof. The energy harvester 100 generates electric energy by using the mechanical force applied by the movement of the mass M.

The energy harvester 100 may have a flat-plate structure. In detail, the energy harvester 100 includes: first and second substrates 110 and 120 spaced apart from each other; first and second electrodes 112 and 122 provided on the first and second substrates 110 and 120; and an energy generator provided between the first and second electrodes 112 and 122. At least one of the first and second substrates 110 and 120 may be connected to the mass M. FIG. 1 illustrates a case where the mass M is connected to the second substrate 120. In other examples, the mass M may be connected to the first substrate 110.

The first and second substrates 110 and 120 may each have a flat-plate structure. For example, each of the first and second substrates 110 and 120 may include a wafer or a hard material such as glass, or may include a flexible material such as plastic, textile, fiber, or metal foil. However, this exemplary embodiment is not limited thereto, and the first and second substrates 110 and 120 may include various other materials. The first electrode 112 is provided on the top surface of the first substrate 110, and the second electrode 122 is provided on the bottom surface of the second substrate 120. For example, the first and second electrodes 112 and 122 may include graphene, carbon nanotube (CNT), indium tin oxide (ITO), metal, or conductive polymer. However, this exemplary embodiment is not limited thereto. The metal may include, for example, silver (Ag), aluminum (Al), copper (Cu), or gold (Au), and may also include other materials.

The energy generator is provided between the first and second electrodes 112 and 122. The energy generator may be a triboelectric generator that generates electric energy by two layers, which are formed of different materials, rubbing against each other, due to the mechanical force generated by the movement of the mass M or changing a distance between the two layers. The triboelectric generator includes: a first triboelectric layer 113 provided on the first electrode 112; and a second triboelectric layer 123 provided on the second electrode 122.

The first triboelectric layer 113 may include a first dielectric or a metal, and the second triboelectric layer 123 may include a second dielectric that is different from the first dielectric. The first triboelectric layer 113 may include a material that tends to be positively charged, such as, for example, polyformaldehyde, ethylcellulose, polyamide, wool, silk, Al, paper, cotton, steel, wood, nickel (Ni), Cu, Ag, or polyvinyl alcohol (PVA). The second triboelectric layer 123 may include a material that tends to be negatively charged, such as silicon rubber, teflon, polydimethylsiloxane (PDMS), kapton, polypropylene, polyethylene, or polyvinyl chloride (PVC). However, this exemplary embodiment of is not limited thereto. For example, the first triboelectric layer 113 may include a material that tends to be negatively charged, and the second triboelectric layer 123 may include a material that tends to be positively charged. The first and second triboelectric layers 113 and 123 may include different materials that have a large difference in their degree of charging. The first triboelectric layer 113 and the second triboelectric layer 123 are spaced apart from each other by a predetermined distance after being charged by direct contact caused by an external pressure. Due to the mechanical force caused by the movement of the mass M, the first and second triboelectric layers 113 and 123 may rub against each other or the distance therebetween may be changed. In this case, a charge density difference may occur between the first and second triboelectric layers 113 and 123, thereby generating electric energy.

The first triboelectric layer 113 may include a plurality of first wires provided on the top surface of the first electrode 112, and the second triboelectric layer 123 may include a plurality of second wires provided on the bottom surface of the second electrode 122. The second wires are spaced apart from the first wires, and the first and second wires may be disposed alternately with each other. The first and second wires may have, for example, a nano-wire shape, but are not limited thereto. When the first and second triboelectric layers 113 and 123 include the first and second wires disposed alternately with each other, the energy harvester 100 may react to a minute external force, and the area of a dielectric interface, at which friction is generated, may be increased, thus making it possible to generate electric energy more efficiently.

The energy harvester 100 may further include at least one spacer 170 provided between the first and second substrates 110 and 120. The spacer 170 functions to maintain a constant distance between the first substrate 110 and the second substrate 120. For example, the spacer 170 may include an elastic material, such as a spring or rubber, or a magnetic material, such as a magnet. However, this exemplary embodiment is not limited thereto. When at least one spacer 170 is disposed between the first and second substrates 110 and 120, the mechanical force caused by the movement of the mass M is more effectively transmitted to the energy harvester 100 to generate electric energy.

In the above-described mobile device, when the mobile device body that is the mass M is moved horizontally or vertically, a mechanical force caused by the movement of the mass M is applied to the energy harvester 100. Due to the mechanical force, the first and second triboelectric layers 113 and 123 may rub against each other or the distance therebetween may be changed. Accordingly, a charge density difference may occur between the first and second triboelectric layers 113 and 123, thereby generating electric energy. As in this embodiment, when the first and second triboelectric layers 113 and 123 include the first and second wires disposed alternately with each other, the energy harvester 100 may react to a minute movement of the mass M in various directions, and the area of a dielectric interface, at which friction is generated, may be increased, thus making it possible to generate electric energy more efficiently. The generated electric energy may be supplied to the mobile device body that is the mass M, or may be stored in a battery. An exemplary case where the energy harvester 100 has a single-layer structure including one triboelectric generator has been described above. However, the energy harvester 100 may also have a multi-layer structure including a stack of a plurality of triboelectric generators.

Figure 3:
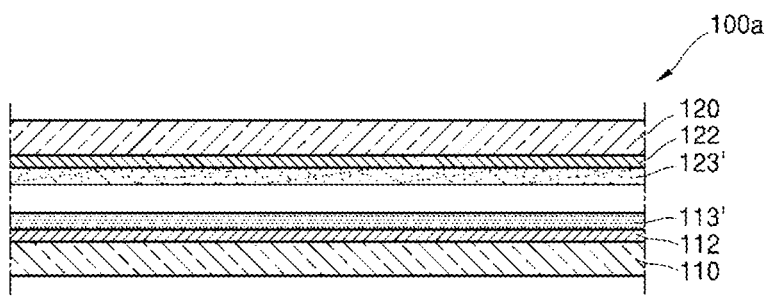
FIG. 3 is a cross-sectional view of an energy harvester according to another exemplary embodiment.

FIG. 3 is a cross-sectional view of an energy harvester 100a according to another exemplary embodiment. FIG. 3 is an enlarged view of a cross-section of an energy harvester 100a as a modification of the energy harvester 100 illustrated in FIGS. 1 and 2, and the same is true of the following drawings. Only differences from the above-described embodiment will be mainly described hereinafter.

Referring to FIG. 3, the energy harvester 100a includes: first and second substrates 110 and 120 spaced apart from each other; first and second electrodes 112 and 122 provided on the first and second substrates 110 and 120; and an energy generator provided between the first and second electrodes 112 and 122. At least one of the first and second substrates 110 and 120 may be connected to the mass M. Since the first and second substrates 110 and 120 and the first and second electrodes 112 and 122 have been described above, a description thereof will be omitted here.

The energy generator is provided between the first and second electrodes 112 and 122. The energy generator may be a triboelectric generator. The triboelectric generator includes: a first triboelectric layer 113' provided on the first electrode 112; and a second triboelectric layer 123' provided on the second electrode 122. The first triboelectric layer 113' may include a first dielectric or a metal, and the second triboelectric layer 123' may include a second dielectric that is different from the first dielectric. The first triboelectric layer 113' and the second triboelectric layer 123' are spaced apart from each other by a predetermined distance after being charged by direct contact caused by an external pressure. Due to the mechanical force caused by the movement of the mass M, the first and second triboelectric layers 113' and 123' may rub against each other or the distance therebetween may be changed. In this case, a charge density difference may occur between the first and second triboelectric layers 113' and 123', thereby generating electric energy. The energy harvester 100a may further include at least one spacer 170 (see FIG. 1) provided between the first and second substrates 110 and 120. For example, the spacer 170 may include an elastic material, such as a spring or rubber, or a magnetic material, such as a magnet. However, this exemplary the embodiment is not limited thereto. The energy harvester 100a may have a single-layer structure including one triboelectric generator, or may have a multi-layer structure including a stack of a plurality of triboelectric generators.

Figure 4:
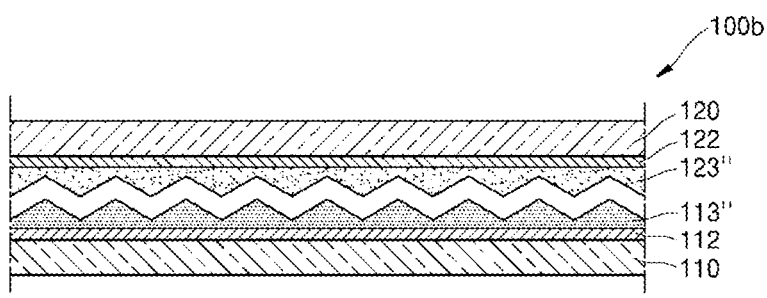
FIG. 4 is a cross-sectional view of an energy harvester according to another exemplary embodiment.

FIG. 4 is a cross-sectional view of an energy harvester 100b according to another exemplary embodiment. Only differences from the above-described embodiment will be mainly described hereinafter.

Referring to FIG. 4, the energy harvester 100b includes: first and second substrates 110 and 120 spaced apart from each other; first and second electrodes 112 and 122 provided on the first and second substrates 110 and 120; and an energy generator provided between the first and second electrodes 112 and 122. At least one of the first and second substrates 110 and 120 may be connected to the mass M. Since the first and second substrates 110 and 120 and the first and second electrodes 112 and 122 have been described above, a description thereof will be omitted here.

The energy generator is provided between the first and second electrodes 112 and 122. The energy generator may be a triboelectric generator. The triboelectric generator includes: a first triboelectric layer 113" provided on the first electrode 112; and a second triboelectric layer 123" provided on the second electrode 122. The first triboelectric layer 113" may include a first dielectric or a metal, and the second triboelectric layer 123" may include a second dielectric that is different from the first dielectric. Due to the mechanical force caused by the movement of the mass M, the first and second triboelectric layers 113" and 123" may rub against each other or the distance therebetween may be changed. In this case, a charge density difference may occur between the first and second triboelectric layers 113" and 123", thereby generating electric energy.

The surfaces of the first and second triboelectric layers 113" and 123" may be rough. In detail, a plurality of first protrusions may be formed on the surface of the first triboelectric layer 113", and a plurality of second protrusions may be formed on the surface of the second triboelectric layer 123". The first and second protrusions are spaced apart from each other, and the first and second protrusions may be disposed alternately with each other. The first and second protrusions may have, for example, a nano-pyramid shape, but are not limited thereto. When the first and second protrusions are alternately formed on the surfaces of the first and second triboelectric layers 113" and 123", the energy harvester 100b may react to a minute movement of the mass M in various directions, and the area of a dielectric interface, at which friction is generated, may be increased, thus making it possible to generate electric energy more efficiently. The energy harvester 100b may further include at least one spacer 170 (see FIG. 1) provided between the first and second substrates 110 and 120. For example, the spacer 170 may include an elastic material, such as a spring or rubber, or a magnetic material, such as a magnet. However, this exemplary embodiment is not limited thereto. The energy harvester 100b may have a single-layer structure including one triboelectric generator, or may have a multi-layer structure including a stack of a plurality of triboelectric generators.

Figure 5:
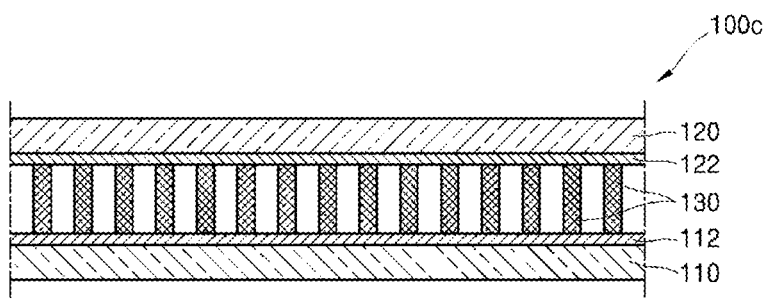
FIG. 5 is a cross-sectional view of an energy harvester according to another exemplary embodiment.

FIG. 5 is a cross-sectional view of an energy harvester 100c according to another exemplary embodiment. Only differences from the above-described embodiment will be mainly described hereinafter.

Referring to FIG. 5, the energy harvester 100c includes: first and second substrates 110 and 120 spaced apart from each other; first and second electrodes 112 and 122 provided on the first and second substrates 110 and 120; and an energy generator provided between the first and second electrodes 112 and 122. At least one of the first and second substrates 110 and 120 may be connected to the mass M. Since the first and second substrates 110 and 120 and the first and second electrodes 112 and 122 have been described above, a description thereof will be omitted here.

The energy generator is provided between the first and second electrodes 112 and 122. The energy generator may be a piezoelectric generator that generates electric energy by being deformed by the movement of the mass M. The piezoelectric generator includes a plurality of piezoelectric nanowires 130. The piezoelectric nanowires 130 may be arranged vertically or may be inclined at an acute angle with respect to the first electrode 112. Although not illustrated in FIG. 5, an insulating layer having a high dielectric constant may be further provided on the top surface of the first electrode 112, in order to uniformly grow the piezoelectric nanowires 130. The piezoelectric nanowires 130 may include, for example, ZnO, SnO, PZT, ZnSnO₃, polyvinylidene fluoride (PVDF), or P(VDF-TrFE), but are not limited thereto. The energy harvester 100c may further include at least one spacer 170 (see FIG. 1) provided between the first and second substrates 110 and 120. For example, the spacer 170 may include an elastic material, such as a spring or rubber, or a magnetic material, such as a magnet. However, this exemplary embodiment is not limited thereto.

In the above mobile device, when the mobile device body that is the mass M is moved horizontally or vertically, a mechanical force caused by the movement of the mass M is applied to the energy harvester 100c. The mechanical force deforms the piezoelectric nanowires 130, and a piezoelectric potential results at both ends of the deformed piezoelectric nanowires 130, thereby generating electric energy. The generated electric energy may be supplied to the mobile device body that is the mass M, or may be stored in the battery. An exemplary case where the energy harvester 100c has a single-layer structure including one piezoelectric generator has been described above. However, the energy harvester 100c may also have a multi-layer structure including a stack of a plurality of piezoelectric generators.

Figure 6:
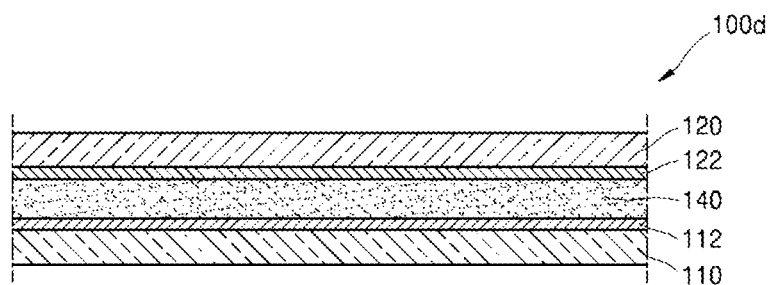
FIG. 6 is a cross-sectional view of an energy harvester according to another exemplary embodiment.

FIG. 6 is a cross-sectional view of an energy harvester 100d according to another exemplary embodiment. Only differences from the above-described embodiment will be mainly described hereinafter.

Referring to FIG. 6, the energy harvester 100d includes: first and second substrates 110 and 120 spaced apart from each other; first and second electrodes 112 and 122 provided on the first and second substrates 110 and 120; and an energy generator provided between the first and second electrodes 112 and 122. At least one of the first and second substrates 110 and 120 may be connected to the mass M. Since the first and second substrates 110 and 120 and the first and second electrodes 112 and 122 have been described above, a description thereof will be omitted here.

The energy generator is provided between the first and second electrodes 112 and 122. The energy generator may be piezoelectric generator. The piezoelectric generator includes a piezoelectric thin-film layer 140. The piezoelectric thin-film layer 140 is deformed by a mechanical force applied by the movement of the mass M, thereby causing a piezoelectric potential to be generated between the top and bottom of the piezoelectric thin-film layer 140. The piezoelectric thin-film layer 140 may include an inorganic material or an organic material. The piezoelectric thin-film layer 140 may include, for example, ZnO, ZnSnO₃, SnO, BaTiO₃, NaNbO₃, PZT, PVDF, or P(VDF-TrFE), but is not limited thereto. The energy harvester 100d may further include at least one spacer 170 (see FIG. 1) provided between the first and second substrates 110 and 120. For example, the spacer 170 may include an elastic material, such as a spring or rubber, or a magnetic material, such as a magnet. However, this exemplary embodiment is not limited thereto. The energy harvester 100d may have a single-layer structure including one piezoelectric generator, or may have a multi-layer structure including a stack of a plurality of piezoelectric generators.

Figure 7:
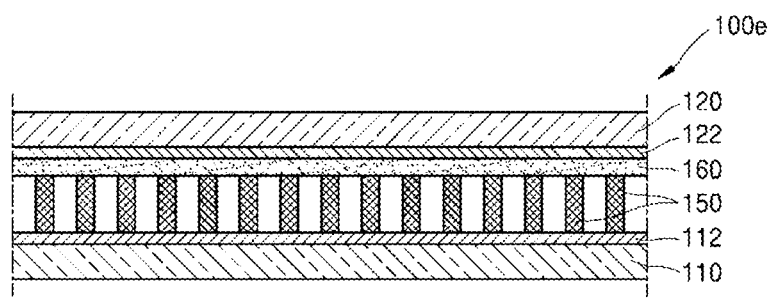
FIG. 7 is a cross-sectional view of an energy harvester according to another exemplary embodiment.

FIG. 7 is a cross-sectional view of an energy harvester 100e according to another exemplary embodiment. Only differences from the above-described embodiment will be mainly described hereinafter.

Referring to FIG. 7, the energy harvester 100e includes: first and second substrates 110 and 120 spaced apart from each other; first and second electrodes 112 and 122 provided on the first and second substrates 110 and 120; and an energy generator provided between the first and second electrodes 112 and 122. At least one of the first and second substrates 110 and 120 may be connected to the mass M. Since the first and second substrates 110 and 120 and the first and second electrodes 112 and 122 have been described above, a description thereof will be omitted here.

The energy generator is provided between the first and second electrodes 112 and 122. The energy generator may be a hybrid electric generator that includes a combination of a piezoelectric generator and a triboelectric generator. The hybrid electric generator includes: a plurality of piezoelectric nanowires 150 provided on the first electrode 112; and a dielectric film 160 provided on the second electrode 122.

The piezoelectric nanowires 150 may be arranged vertically or may be inclined at an angle on the first electrode 112. Although not illustrated in FIG. 7, an insulating layer having a high dielectric constant may be further provided on the top surface of the first electrode 112, in order to uniformly grow the piezoelectric nanowires 150. The piezoelectric nanowires 150 may include a material generating a piezoelectric potential at both ends thereof due to deformation, for example, ZnO, SnO, PZT, ZnSnO₃, PVDF, or P(VDF-TrFE), but are not limited thereto. The dielectric film 160 is provided between the piezoelectric nanowires 150 and the second electrode 122. The dielectric film 160 insulates between the first electrode 112 and the second electrode 122, and generates electric energy by a charge density difference caused by a change in the distance between the dielectric film 160 and the first electrode 112.

The dielectric film 160 may include an inorganic material or a polymer-based organic material. For example, the dielectric film 160 may include silicon rubber, teflon, PDMS, PVD, kapton, polypropylene, polyethylene, PVC, polyformaldehyde, ethylcellulose, polyamide, wool, silk, or PVA. The energy harvester 100e may further include at least one spacer 170 (see FIG. 1) provided between the first and second substrates 110 and 120. For example, the spacer 170 may include an elastic material, such as a spring or rubber, or a magnetic material, such as a magnet. However, this exemplary embodiment is not limited thereto.

In the above structure, when a mechanical force caused by the movement of the mass M is applied to the energy harvester 100e, electric energy may be generated by piezoelectricity caused by the deformation of the piezoelectric nanowires 150, and electric energy may be generated by triboelectricity caused by a change in the distance between the dielectric film 160 and the first electrode 112. The energy harvester 100e may have a single-layer structure including one hybrid electric generator, or may have a multi-layer structure including a stack of a plurality of hybrid electric generators. It is also possible to implement an energy harvester that has a multi-layer structure including a stack of at least two of the piezoelectric generator, the triboelectric generator, and the hybrid electric generator.

Figure 8:
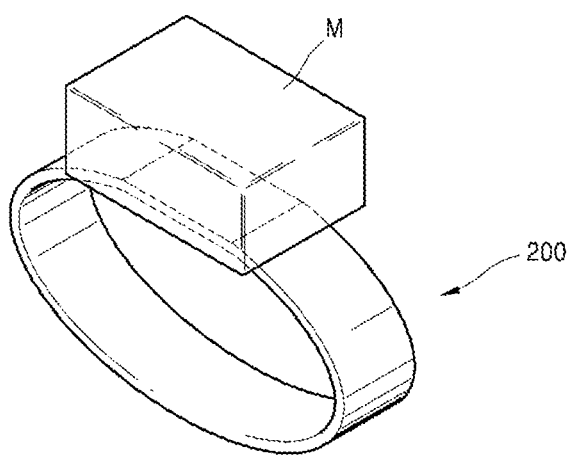
FIG. 8 is a perspective view of a mobile device including an energy harvester according to another exemplary embodiment.
Figure 9:
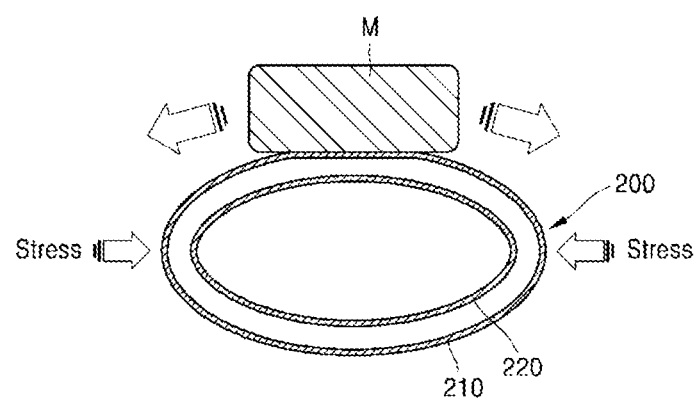
FIG. 9 is a cross-sectional view of the mobile device illustrated in FIG. 8.

FIG. 8 is a perspective view of a mobile device including an energy harvester according to another exemplary embodiment. FIG. 9 is a cross-sectional view of the mobile device illustrated in FIG. 8.

Referring to FIGS. 8 and 9, the mobile device includes a mass M and an energy harvester 200 configured to generate electric energy by the movement of the mass M. The mobile device may be, for example, a device attached to a human body. For example, the mobile device may include a smart watch, and may also include an MP3 player, a Bluetooth device, a mobile phone, a radio, a biosensor, a position sensor, a body temperature sensor, or a blood pressure sensor, which are attached to a human body. However, this exemplary embodiment is not limited thereto. The mass M is a mobile device body. The mass M is connected to the energy harvester 200 to apply a mechanical force to the energy harvester 200 by the movement thereof. The energy harvester 200 generates electric energy by using the mechanical force generated by the movement of the mass M.

The energy harvester 200 may have a band-type structure. In detail, the energy harvester 200 includes: first and second substrates 210 and 220 spaced apart from each other; first and second electrodes (not illustrated) provided on the first and second substrates 210 and 220; and an energy generator (not illustrated) provided between the first and second electrodes. At least one of the first and second substrates 210 and 220 may be connected to the mass M. FIG. 9 illustrates a case where the mass M is connected to the second substrate 220. In other examples, the mass M may be connected to the first substrate 210.

The first and second substrates 210 and 220 may have a band-type structure. For example, the first and second substrates 210 and 220 may include a flexible material such as plastic, textile, or metal foil. However, this exemplary embodiment is not limited thereto, and the first and second substrates 210 and 220 may include various other materials. The first and second electrodes are provided on the first and second substrates 210 and 220. For example, the first and second electrodes may include a flexible conductive material, such as graphene, CNT, ITO, metal, or conductive polymer. However, this exemplary embodiment is not limited thereto. The energy generator is provided between the first and second electrodes. The energy generator may be a piezoelectric generator, a triboelectric generator, or a hybrid electric generator that includes a combination of a piezoelectric generator and a triboelectric generator. Since the energy generator has been described in detail in the above-described embodiments, a description thereof will be omitted here.

In the above mobile device, when the mobile device body that is the mass M is moved horizontally or vertically by, for example, the movement of a human body, a mechanical force caused by the movement of the mass M is applied to the energy harvester 200. The energy harvester 200 may generate electric energy by using the applied mechanical force.

Figure 10:
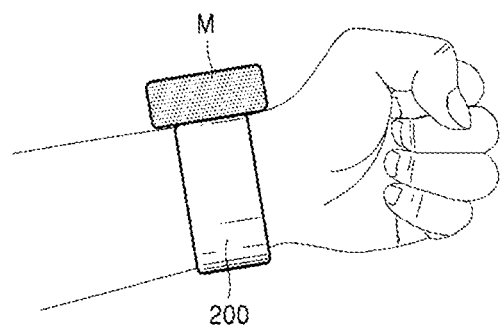
FIG. 10 is a view illustrating a state in which the mobile device illustrated in FIG. 8 is worn on a wrist.

FIG. 10 is a view illustrating a state in which the mobile device illustrated in FIG. 8 is worn on a wrist. A representative example of the mobile device illustrated in FIG. 10 may be a smart watch. In this case, the mass M may be a watch body, and the band-type energy harvester 100 may be a watchband that is worn on the wrist. In the state illustrated in FIG. 10, when the wrist is moved, the mass M is moved and a mechanical force caused by the movement of the mass M is applied to the energy harvester 100. The energy harvester 100 may generate electric energy by using the mechanical force of the mass M. The generated electric energy may be supplied to the watch body, or may be stored in a battery. In addition to the smart watch, the mobile device may include an MP3 player, a Bluetooth device, a mobile phone, a radio, a biosensor, a position sensor, a body temperature sensor, or a blood pressure sensor, which are attached to a human body.

Figure 11:
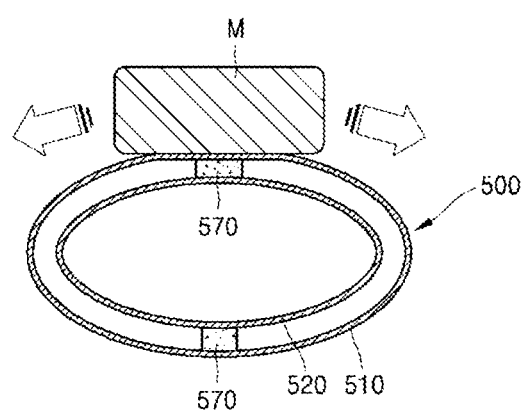
FIG. 11 is a cross-sectional view of a mobile device including an energy harvester according to another exemplary embodiment.

FIG. 11 is a cross-sectional view of a mobile device including an energy harvester 500 according to another exemplary embodiment.

Referring to FIG. 11, the mobile device includes a mass M and an energy harvester 500 configured to generate electric energy by the movement of the mass M. The energy harvester 500 generates electric energy by using a mechanical force generated by the movement of the mass M.

The energy harvester 500 may have a band-type structure. In detail, the energy harvester 500 includes: first and second substrates 510 and 520 spaced apart from each other; first and second electrodes (not illustrated) provided on the first and second substrates 510 and 520; an energy generator (not illustrated) provided between the first and second electrodes; and at least one spacer 570 provided on the first and second substrates 510 and 520. At least one of the first and second substrates 510 and 520 may be connected to the mass M. Since the first and second substrates 510 and 520 and the first and second electrodes have been described above, a description thereof will be omitted here. The energy generator may be a piezoelectric generator, a triboelectric generator, or a hybrid electric generator that includes a combination of a piezoelectric generator and a triboelectric generator. Since the energy generator has been described in detail in the above-described embodiments, a description thereof will be omitted here.

The spacer 570 is provided between the first and second substrates 510 and 520 to maintain a constant distance between the first and second substrates 510 and 520. The spacer 570 may include, for example, an elastic material, such as a spring or rubber, or a magnetic material, such as a magnet, but is not limited thereto. When the spacer 570 is disposed between the first and second substrates 510 and 520, the mechanical force caused by the movement of the mass M may be more effectively transmitted to the energy harvester 500 to generate electric energy.

Figure 12:
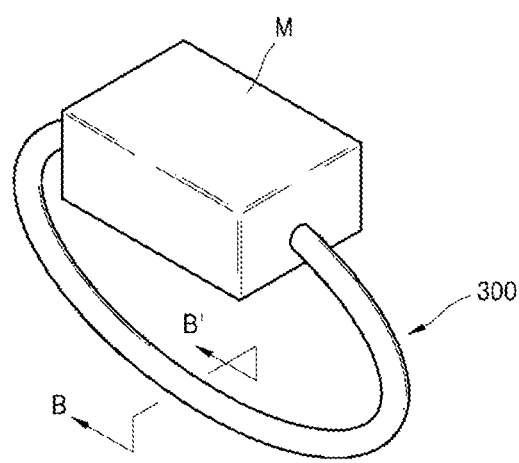
FIG. 12 is a perspective view of a mobile device including an energy harvester according to another exemplary embodiment.
Figure 13:
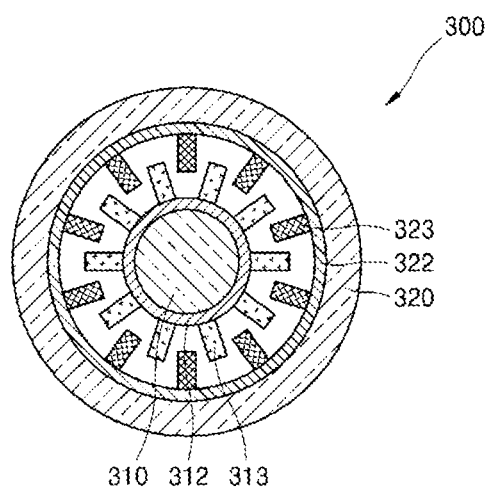
FIG. 13 is a cross-sectional view of the energy harvester illustrated in FIG. 12, which is taken along a line B-B' of FIG. 12.

FIG. 12 is a perspective view of a mobile device including an energy harvester 300 according to another exemplary embodiment. FIG. 13 is a cross-sectional view of the energy harvester 300 illustrated in FIG. 12, which is taken along a line B-B' of FIG. 12.

Referring to FIGS. 12 and 13, the mobile device includes a mass M and an energy harvester 300 configured to generate electric energy by the movement of the mass M. The mobile device may be, for example, a device attached to a human body, but is not limited thereto. The mass M is a mobile device body. The mass M is connected to the energy harvester 300 to apply a mechanical force to the energy harvester 300 by the movement thereof. The energy harvester 300 generates electric energy by using the mechanical force generated by the movement of the mass M.

The energy harvester 300 may have a core-shell structure. In detail, the energy harvester 300 includes: first and second substrates 310 and 320 spaced apart from each other; first and second electrodes 312 and 322 provided on the first and second substrates 310 and 320; and an energy generator provided between the first and second electrodes 312 and 322. At least one of the first and second substrates 310 and 320 may be connected to the mass M.

The first and second substrates 310 and 320 may have a core-shell structure. The first substrate 310 may be a wire-shaped core. Although not illustrated in FIGS. 12 and 13, the first substrate 310 may be a tube-shaped core. The second substrate 320 may be a tube-shaped shell that surrounds the first substrate 310. The first and second substrates 310 and 320 may include a flexible material. The first and second substrates 310 and 320 may include, for example, plastic, textile, fiber, or metal, but they are not limited thereto.

The first electrode 312 is provided on the outer surface of the first substrate 310, and the second electrode 322 is provided on the inner surface of the second substrate 320. The first and second electrodes 312 and 322 may include a flexible conductive material. For example, the first and second electrodes 312 and 322 may include graphene, CNT, ITO, metal, or conductive polymer. However, this exemplary embodiment is not limited thereto. The metal may include, for example, Ag, Al, Cu, or Au, and may also include other materials.

The energy generator is provided between the first and second electrodes 312 and 322. The energy generator may be a triboelectric generator. The triboelectric generator includes: a first triboelectric layer 313 provided on the first electrode 312; and a second triboelectric layer 323 provided on the second electrode 322. The first triboelectric layer 313 may include a first dielectric or a metal, and the second triboelectric layer 323 may include a second dielectric that is different from the first dielectric. The first triboelectric layer 313 may include a material that tends to be positively charged, such as, for example, polyformaldehyde, ethylcellulose, polyamide, wool, silk, Al, paper, cotton, steel, wood, Ni, Cu, Ag, or PVA. The second triboelectric layer 323 may include a material that tends to be negatively charged, such as silicon rubber, teflon, PDMS, kapton, polypropylene, polyethylene, or PVC. However, this exemplary embodiment is not limited thereto. For example, the first triboelectric layer 313 may include a material that tends to be negatively charged, and the second triboelectric layer 323 may include a material that tends to be positively charged. The first and second triboelectric layers 313 and 323 may include different materials that have a large difference in their degree of charging. The first triboelectric layer 313 and the second triboelectric layer 323 are spaced apart from each other by a predetermined distance after being charged by direct contact by an external pressure. Due to the mechanical force caused by the movement of the mass M, the first and second triboelectric layers 313 and 323 may rub against each other or the distance therebetween may be changed. In this case, a charge density difference may occur between the first and second triboelectric layers 313 and 323, thereby generating electric energy.

The first triboelectric layer 313 may include a plurality of first wires provided on the outer surface of the first electrode 312, and the second triboelectric layer 323 may include a plurality of second wires provided on the inner surface of the second electrode 322. The second wires are spaced apart from the first wires, and the first and second wires may be disposed alternately with each other. The first and second wires may have, for example, a nano-wire shape, but are not limited thereto. When the first and second triboelectric layers 313 and 323 include the first and second wires disposed alternately with each other, the energy harvester 300 may react to a minute external force, and the area of a dielectric interface, at which friction is generated, may be increased, thus making it possible to generate electric energy more efficiently. Although not illustrated in FIGS. 12 and 13, at least one spacer may be further provided between the first and second substrates 310 and 320. The spacer functions to maintain a constant distance between the first substrate 310 and the second substrate 320. For example, the spacer may include an elastic material, such as a spring or rubber, or a magnetic material, such as a magnet. When at least one spacer is disposed between the first and second substrates 310 and 320, the mechanical force caused by the movement of the mass M may be more effectively transmitted to the energy harvester 300 to generate electric energy.

In the above mobile device, when the mobile device body that is the mass M is moved horizontally or vertically, a mechanical force caused by the movement of the mass M is applied to the energy harvester 300. Due to the mechanical force, the first and second triboelectric layers 313 and 323 may rub against each other or the distance therebetween may be changed. Accordingly, a charge density difference may occur between the first and second triboelectric layers 313 and 323, thereby generating electric energy. When the first and second triboelectric layers 313 and 323 include the first and second wires disposed alternately with each other, the energy harvester 300 may react to a minute movement of the mass M in various directions, and the area of a dielectric interface, at which friction is generated, may be increased, thus making it possible to generate electric energy more efficiently. The generated electric energy may be supplied to the mobile device body that is the mass M, or may be stored in a battery. An exemplary case where the energy harvester 300 has a single-layer structure including one triboelectric generator has been described above. However, the energy harvester 300 may also have a multi-layer structure including a stack of a plurality of triboelectric generators.

Figure 14:
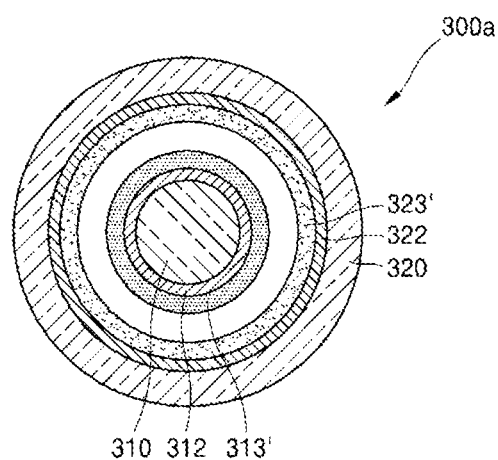
FIG. 14 is a cross-sectional view of an energy harvester according to another exemplary embodiment.

FIG. 14 is a cross-sectional view of an energy harvester 300a according to another exemplary embodiment. FIG. 14 is an enlarged view of a cross-section of an energy harvester 300a as a modification of the energy harvester 300 illustrated in FIGS. 12 and 13, and the same is true of the following drawings. Only differences from the above embodiment will be mainly described hereinafter.

Referring to FIG. 14, the energy harvester 300a includes: first and second substrates 310 and 320 spaced apart from each other; first and second electrodes 312 and 322 provided on the first and second substrates 310 and 320; and an energy generator provided between the first and second electrodes 312 and 322. The first and second substrates 310 and 320 may have a core-shell structure. The first substrate 310 may be a wire-shaped core or a tube-shaped core, and the second substrate 320 may be a tube-shaped shell that surrounds the first substrate 310. The first electrode 312 is provided on the outer surface of the first substrate 310, and the second electrode 322 is provided on the inner surface of the second substrate 320. Since the first and second substrates 310 and 320 and the first and second electrodes 312 and 322 have been described above, a detailed description thereof will be omitted here.

The energy generator is provided between the first and second electrodes 312 and 322. The energy generator may be a triboelectric generator. The triboelectric generator includes: a first triboelectric layer 312' provided on the first electrode 312; and a second triboelectric layer 323' provided on the second electrode 322. The first triboelectric layer 313' may include a first dielectric or a metal, and the second triboelectric layer 323' may include a second dielectric that is different from the first dielectric. The first triboelectric layer 313' and the second triboelectric layer 323' are spaced apart from each other by a predetermined distance after being charged by direct contact by an external pressure.

Due to the mechanical force caused by the movement of the mass M, the first and second triboelectric layers 313' and 323' may rub against each other or the distance therebetween may be changed. In this case, a charge density difference may occur between the first and second triboelectric layers 313' and 323', thereby generating electric energy. Although not illustrated in FIG. 14, at least one spacer may be further provided between the first and second substrates 310 and 320. The energy harvester 300a may have a single-layer structure including one triboelectric generator, or may have a multi-layer structure including a stack of a plurality of triboelectric generators.

Figure 15:
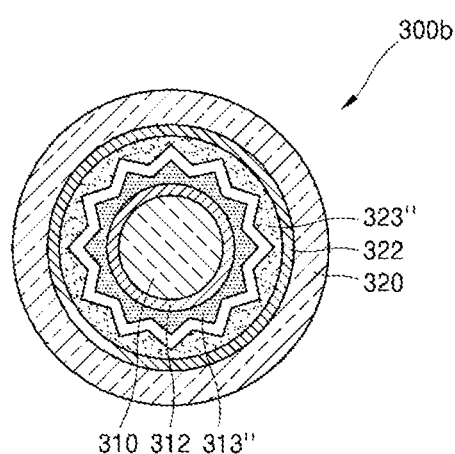
FIG. 15 is a cross-sectional view of an energy harvester according to another exemplary embodiment.

FIG. 15 is a cross-sectional view of an energy harvester 300b according to another exemplary embodiment. Only differences from the above-described embodiment will be mainly described hereinafter.

Referring to FIG. 15, the energy harvester 300b includes: first and second substrates 310 and 320 spaced apart from each other; first and second electrodes 312 and 322 provided on the first and second substrates 310 and 320; and an energy generator provided between the first and second electrodes 312 and 322. The first and second substrates 310 and 320 may have a core-shell structure. The first substrate 310 may be a wire-shaped core or a tube-shaped core, and the second substrate 320 may be a tube-shaped shell that surrounds the first substrate 310. The first electrode 312 is provided on the outer surface of the first substrate 310, and the second electrode 322 is provided on the inner surface of the second substrate 320. Since the first and second substrates 310 and 320 and the first and second electrodes 312 and 322 have been described above, a detailed description thereof will be omitted here.

The energy generator is provided between the first and second electrodes 312 and 322. The energy generator may be a triboelectric generator. The triboelectric generator includes: a first triboelectric layer 313" provided on the first electrode 312; and a second triboelectric layer 323" provided on the second electrode 322. The first triboelectric layer 313" may include a first dielectric or a metal, and the second triboelectric layer 323" may include a second dielectric that is different from the first dielectric. By the mechanical force caused by the movement of the mass M, the first and second triboelectric layers 313" and 323" may rub against each other or the distance therebetween may be changed. In this case, a charge density difference may occur between the first and second triboelectric layers 313" and 323", thereby generating electric energy.

The surfaces of the first and second triboelectric layers 313" and 323" may be rough. In detail, a plurality of first protrusions may be formed on the surface of the first triboelectric layer 313", and a plurality of second protrusions may be formed on the surface of the second triboelectric layer 323". The first and second protrusions are spaced apart from each other, and the first and second protrusions may be disposed alternately with each other. The first and second protrusions may have, for example, a nano-pyramid shape, but are not limited thereto. When the first and second protrusions are alternately formed on the surfaces of the first and second triboelectric layers 313" and 323", the energy harvester 300b may react to a minute movement of the mass M in various directions, and the area of a dielectric interface, at which friction is generated, may be increased, thus making it possible to generate electric energy more efficiently. Although not illustrated in FIG. 15, at least one spacer may be further provided between the first and second substrates 310 and 320. The energy harvester 300b may have a single-layer structure including one triboelectric generator, or may have a multi-layer structure including a stack of a plurality of triboelectric generators.

Figure 16:
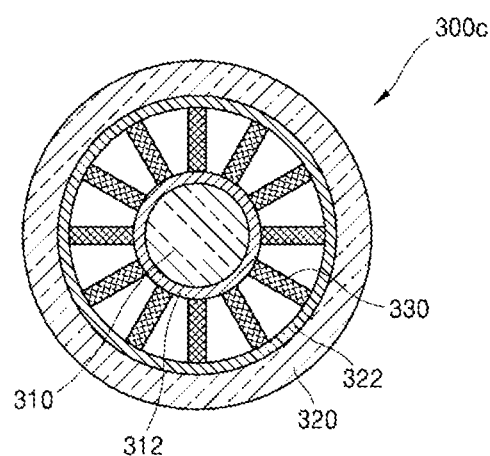
FIG. 16 is a cross-sectional view of an energy harvester according to another exemplary embodiment.

FIG. 16 is a cross-sectional view of an energy harvester 300c according to another exemplary embodiment. Only differences from the above-described embodiment will be mainly described hereinafter.

Referring to FIG. 16, the energy harvester 300c includes: first and second substrates 310 and 320 spaced apart from each other; first and second electrodes 312 and 322 provided on the first and second substrates 310 and 320; and an energy generator provided between the first and second electrodes 312 and 322. The first and second substrates 310 and 320 may have a core-shell structure. The first substrate 310 may be a wire-shaped core or a tube-shaped core, and the second substrate 320 may be a tube-shaped shell that surrounds the first substrate 310. The first electrode 312 is provided on the outer surface of the first substrate 310, and the second electrode 322 is provided on the inner surface of the second substrate 320. Since the first and second substrates 310 and 320 and the first and second electrodes 312 and 322 have been described above, a detailed description thereof will be omitted here.

The energy generator is provided between the first and second electrodes 312 and 322. The energy generator may be piezoelectric generator. The piezoelectric generator includes a plurality of piezoelectric nanowires 330 provided between the first and second electrodes 312 and 322. The piezoelectric nanowires 330 may be arranged vertically or may be inclined at an angle on the outer surface of the first electrode 312. Although not illustrated in FIG. 16, an insulating layer having a high dielectric constant may be further provided on the top surface of the first electrode 312, in order to uniformly grow the piezoelectric nanowires 330. The piezoelectric nanowires 330 may include, for example, ZnO, SnO, PZT, $ZnSnO_3$, PVDF, or P(VDF-TrFE), but are not limited thereto. Although not illustrated in FIG. 16, at least one spacer may be further provided between the first and second substrates 310 and 320.

In the above-described structure, when the mobile device body that is the mass M is moved, a mechanical force caused by the movement of the mass M is applied to the energy harvester 300c. The mechanical force deforms the piezoelectric nanowires 330, and a piezoelectric potential results at both ends of the deformed piezoelectric nanowires 330, thereby generating electric energy. The generated electric energy may be supplied to the mobile device body that is the mass M, or may be stored in the battery. The energy harvester 300c may have a single-layer structure including one piezoelectric generator, or may have a multi-layer structure including a stack of a plurality of piezoelectric generators.

Figure 17:
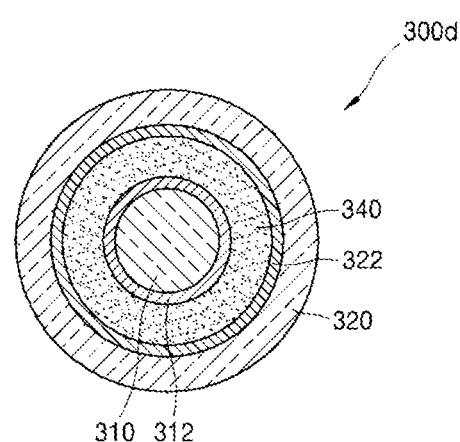
FIG. 17 is a cross-sectional view of an energy harvester according to another exemplary embodiment.

FIG. 17 is a cross-sectional view of an energy harvester 300d according to another exemplary embodiment. Only differences from the above-described embodiment will be mainly described hereinafter.

Referring to FIG. 17, the energy harvester 300d includes: first and second substrates 310 and 320 spaced apart from each other; first and second electrodes 312 and 322 provided on the first and second substrates 310 and 320; and an energy generator provided between the first and second electrodes 312 and 322. The first and second substrates 310 and 320 may have a core-shell structure. The first substrate 310 may be a wire-shaped core or a tube-shaped core. The second substrate 320 may be a tube-shaped shell that surrounds the first substrate 310. The first electrode 312 is provided on the outer surface of the first substrate 310, and the second electrode 322 is provided on the inner surface of the second substrate 320. Since the first and second substrates 310 and 320 and the first and second electrodes 312 and 322 have been described above, a detailed description thereof will be omitted here.

The energy generator is provided between the first and second electrodes 312 and 322. The energy generator may be piezoelectric generator. The piezoelectric generator includes a piezoelectric thin-film layer 340. The piezoelectric thin-film layer 340 is deformed by a mechanical force generated by the movement of the mass M, thereby causing a piezoelectric potential to be generated between the top and bottom of the piezoelectric thin-film layer 340. The piezoelectric thin-film layer 340 may include an inorganic material or an organic material. The piezoelectric thin-film layer 340 may include, for example, ZnO, $ZnSnO_3$, SnO, $BaTiO_3$, $NaNbO_3$, PZT, PVDF, or P(VDF-TrFE), but is not limited thereto. Although not illustrated in FIG. 17, at least one spacer may be further provided between the first and second substrates 310 and 320. The energy harvester 300d may have a single-layer structure including one piezoelectric generator, or may have a multi-layer structure including a stack of a plurality of piezoelectric generators.

Figure 18:
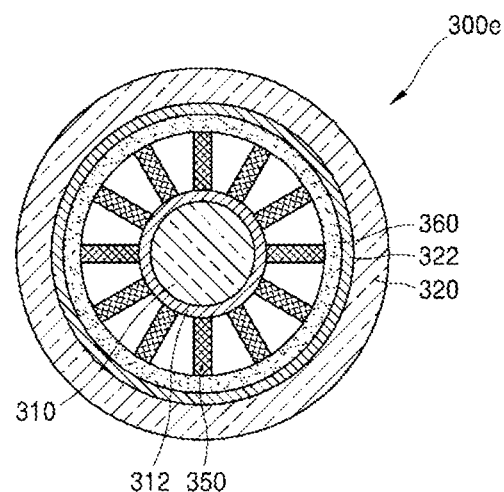
FIG. 18 is a cross-sectional view of an energy harvester according to another exemplary embodiment.

FIG. 18 is a cross-sectional view of an energy harvester 300e according to another exemplary embodiment. Only differences from the above embodiment will be mainly described hereinafter.

Referring to FIG. 18, the energy harvester 300e includes: first and second substrates 310 and 320 spaced apart from each other; first and second electrodes 312 and 322 provided on the first and second substrates 310 and 320; and an energy generator provided between the first and second electrodes 312 and 322. The first and second substrates 310 and 320 may have a core-shell structure. The first substrate 310 may be a wire-shaped core or a tube-shaped core. The second substrate 320 may be a tube-shaped shell that surrounds the first substrate 310. The first electrode 312 is provided on the outer surface of the first substrate 310, and the second electrode 322 is provided on the inner surface of the second substrate 320. Since the first and second substrates 310 and 320 and the first and second electrodes 312 and 322 have been described above, a detailed description thereof will be omitted here.

The energy generator is provided between the first and second electrodes 312 and 322. The energy generator may be a hybrid electric generator that includes a combination of a piezoelectric generator and a triboelectric generator. The hybrid electric generator includes: a plurality of piezoelectric nanowires 350 provided on the first electrode 312; and a dielectric film 360 provided on the second electrode 322.

The piezoelectric nanowires 350 may be arranged vertically or may be inclined at an angle on the first electrode 312. Although not illustrated in FIG. 18, an insulating layer having a high dielectric constant may be further provided on the top surface of the first electrode 312, in order to uniformly grow the piezoelectric nanowires 350. The piezoelectric nanowires 350 may include a material generating a piezoelectric potential at both ends thereof due to deformation, for example, ZnO, SnO, PZT, $ZnSnO_3$, PVDF, or P(VDF-TrFE), but are not limited thereto. The dielectric film 360 is provided between the piezoelectric nanowires 350 and the second electrode 322. The dielectric film 360 insulates between the first electrode 312 and the second electrode 322, and generates electric energy by a charge density difference caused by a change in the distance between the dielectric film 360 and the first electrode 312. The dielectric film 360 may include an inorganic material or a polymer-based organic material. For example, the dielectric film 360 may include silicon rubber, teflon, PDMS, PVD, kapton, polypropylene, polyethylene, PVC, polyformaldehyde, ethylcellulose, polyamide, wool, silk, or PVA. Although not illustrated in FIG. 18, at least one spacer may be further provided between the first and second substrates 310 and 320.

In the above-described structure, when a mechanical force caused by the movement of the mass M is applied to the energy harvester 300e, electric energy may be generated by piezoelectricity caused by the deformation of the piezoelectric nanowires 350, and electric energy may be generated by triboelectricity caused by a change in the distance between the dielectric film 360 and the first electrode 312. The energy harvester 300e may have a single-layer structure including one hybrid electric generator, or may have a multi-layer structure including a stack of a plurality of hybrid electric generators. It is also possible to implement an energy harvester that has a multi-layer structure including a stack of at least two of the piezoelectric generator, the triboelectric generator, and the hybrid electric generator.

Figure 19:
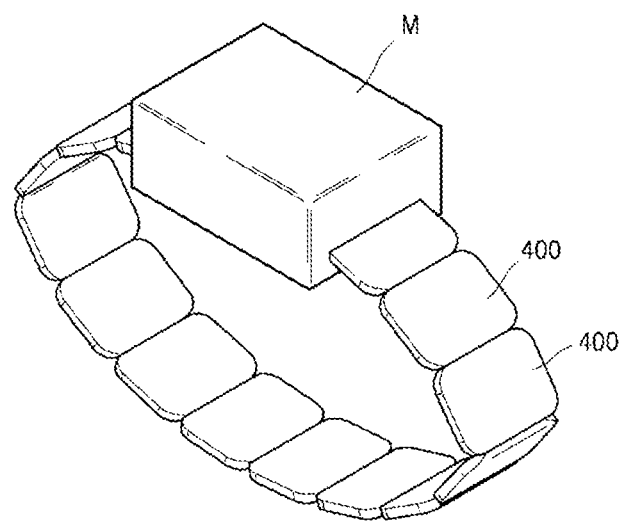
FIG. 19 is a perspective view of a mobile device including a plurality of energy harvesters according to another exemplary embodiment.

FIG. 19 is a perspective view of a mobile device including a plurality of energy harvesters 400 according to another exemplary embodiment.

Referring to FIG. 19, the mobile device includes a mass M and a plurality of energy harvesters 400 connected to each other to generate electric energy by the movement of the mass M. The mass M is a mobile device body. The mass M is connected to at least one of the energy harvesters 400 to apply a mechanical force to the energy harvesters 400 by the movement thereof. Each of the energy harvesters 400 generates electric energy by using a mechanical force generated by the movement of the mass M. The energy harvesters 400 may be connected to each other to have a band-type structure.

Each of the energy harvesters 300b may include at least one of a piezoelectric generator, a triboelectric generator, and a hybrid electric generator that includes a combination of a piezoelectric generator and a triboelectric generator. Since the energy harvester has been described in detail in the above-described embodiments, a description thereof will be omitted here.

In the above structure, when the mass M is moved by the movement of a human body, a mechanical force is applied to the energy harvesters 400 connected to the mass M, and the surrounding energy harvesters 400, and each of the energy harvesters 400 may generate electric energy by using the mechanical force. When the energy harvesters 400 are electrically connected in series to each other, more electric energy may be generated. The generated electric energy may be supplied to the mobile device body that is the mass M, or may be stored in the battery.

As described above, according to the one or more of the above exemplary embodiments, when the mobile device body that is the mass is moved by the movement of a human body, the energy harvester may generate electric energy by using the mechanical force applied by the movement of the mass. The generated electric energy may be supplied to the mobile device body that is the mass M, or may be stored in the battery. The mobile device may be applied to various fields, such as, for example, a smart watch, an MP3 player, a Bluetooth device, a mobile phone, a radio, a biosensor, a position sensor, a body temperature sensor, and a blood pressure sensor, which are attached to a human body. While the exemplary embodiments have been described above, those of ordinary skill in the art will understand that various modifications may be made in the embodiments.

It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:

1. An energy harvester comprising:
a first substrate and a second substrate spaced apart from the first substrate, wherein one of the first substrate and the second substrate is configured to be connected to a mass;
a first electrode provided on the first substrate and a second electrode disposed on the second substrate; and
an energy generator provided between the first electrode and the second electrode; wherein the energy generator generates electric energy upon a relative movement between the first substrate and the second substrate caused by a movement of the mass,
wherein the energy generator comprises a triboelectric generator,
wherein the triboelectric generator comprises:
a first triboelectric layer provided on the first electrode and comprising one of a first dielectric and a metal; and
a second triboelectric layer provided on the second electrode and comprising a second dielectric that is different from the first dielectric.

2. The energy harvester of claim 1, wherein the first substrate and the second substrate each are in the shape of a band-type structure, a flat-plate structure, or a core-shell structure.

3. The energy harvester of claim 1, wherein the energy generator further comprises a piezoelectric generator.

4. The energy harvester of claim 3, wherein the piezoelectric generator comprises a plurality of piezoelectric nanowires provided between the first substrate and the second substrate.

5. The energy harvester of claim 4, wherein the piezoelectric generator further comprises a dielectric film provided between the second electrode and the plurality of piezoelectric nanowires.

6. The energy harvester of claim 3, wherein the piezoelectric generator comprises a piezoelectric thin-film layer provided between the first electrode and the second electrode.

7. The energy harvester of claim 1, wherein the triboelectric generator further comprises a plurality of first protrusions disposed on a surface of the first triboelectric layer, and a plurality of second protrusions disposed on a surface of the second triboelectric layer.

8. The energy harvester of claim 1, wherein the first triboelectric layer comprises a plurality of first wires provided on the first electrode, and the second triboelectric layer comprises a plurality of second wires provided on the second electrode.

9. The energy harvester of claim 1, further comprising at least one spacer provided between the first substrate and the second substrate, wherein the at least one spacer maintains a distance between the first substrate and the second.

10. A mobile device comprising:
a mobile device body; and
an energy harvester connected to the mobile device body, wherein the energy harvester generates electric energy based on a movement of the mobile device body,
wherein the energy harvester comprises:
a first substrate and a second substrate spaced apart from the first substrate, wherein one of the first substrate and the second substrate is connected to the mobile device body;
a first electrode provided on the first substrate and a second electrode provided on the second substrate; and
an energy generator provided between the first electrode and the second electrode, wherein the energy generator generates electric energy upon a relative movement between the first substrate and the second substrate caused by a movement of the mobile device body,
wherein the energy generator comprises a triboelectric generator, wherein the triboelectric generator comprises:
a first triboelectric layer provided on the first electrode and comprising one of a first dielectric and a metal; and
a second triboelectric layer provided on the second electrode and comprising a second dielectric that is different from the first dielectric.

11. The mobile device of claim 10, wherein the first substrate and the second substrate each are in the shape of a band-type structure, a flat-plate structure, or a core-shell structure.

12. The mobile device of claim 10, wherein the energy generator further comprises a piezoelectric generator.

13. The mobile device of claim 12, wherein the piezoelectric generator comprises a plurality of piezoelectric nanowires provided between the first substrate and the second substrate.

14. The mobile device of claim 13, wherein the piezoelectric generator further comprises a dielectric film provided between the second electrode and the plurality of piezoelectric nanowires.

15. The mobile device of claim 12, wherein the piezoelectric generator comprises a piezoelectric thin-film layer provided between the first electrode and the second electrode.

16. The mobile device of claim 10, wherein the triboelectric generator further comprises a plurality of first protrusions disposed on a surface of the first triboelectric layer, and a plurality of second protrusions disposed on a surface of the second triboelectric layer.

17. A mobile device comprising:
   a mobile device body; and
   a plurality of energy harvesters connected to each other, wherein at least one of the energy harvesters is connected to the mobile device body and generates electric energy based on a movement of the mobile device body,
   wherein the at least one energy harvester comprises:
      a first substrate and a second substrate spaced apart from the first substrate, wherein one of the first substrate and the second substrate is connected to the mobile device body;
      a first electrode provided on the first substrate and a second electrode provided on the second substrate; and
      an energy generator provided between the first electrode and the second electrode, wherein the energy generator generates electric energy upon a relative movement between the first substrate and the second substrate caused by a movement of the mobile device body,
   wherein the at least one energy generator comprises a triboelectric generator, wherein the triboelectric generator comprises:
      a first triboelectric layer provided on the first electrode and comprising one of a first dielectric and a metal; and
      a second triboelectric layer provided on the second electrode and comprising a second dielectric that is different from the first dielectric.

18. The mobile device of claim 17, wherein the energy generator further comprises a piezoelectric generator.

* * * * *